US009608630B2

(12) United States Patent
Hollis

(10) Patent No.: US 9,608,630 B2
(45) Date of Patent: Mar. 28, 2017

(54) REFERENCE VOLTAGE CIRCUITS AND ON-DIE TERMINATION CIRCUITS, METHODS FOR UPDATING THE SAME, AND METHODS FOR TRACKING SUPPLY, TEMPERATURE, AND/OR PROCESS VARIATION

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1765 days.

(21) Appl. No.: 12/436,683

(22) Filed: May 6, 2009

(65) Prior Publication Data

US 2010/0283503 A1 Nov. 11, 2010

(51) Int. Cl.

*H03K 17/16* (2006.01)
*H03K 19/00* (2006.01)
*H03K 19/003* (2006.01)
*H04L 25/02* (2006.01)

(52) U.S. Cl.

CPC ... *H03K 19/0005* (2013.01); *H03K 19/00384* (2013.01); *H04L 25/0278* (2013.01); *H04L 25/0298* (2013.01)

(58) Field of Classification Search

USPC ...................... 326/21, 26, 30, 81–83, 86–87; 327/108–109

See application file for complete search history.

(56) References Cited

U.S. PATENT DOCUMENTS 6,297,624 B1 * 10/2001 Mitsui ...................... G05F 1/465 323/314
6,992,508 B2 * 1/2006 Chow ............ H03K 19/018585 326/82
7,323,900 B2 * 1/2008 Kim ....................... G11C 29/02 326/30
7,372,295 B1 * 5/2008 Wei ................................ 326/30
7,408,378 B2 * 8/2008 Best .................... H04L 25/0278 326/30
7,439,760 B2 * 10/2008 Nguyen .............. H04L 25/0278 326/30
7,486,104 B2 * 2/2009 Oh ...................... G06F 13/4086 326/30
7,492,287 B2 2/2009 Hollis
7,501,963 B1 3/2009 Hollis
7,595,656 B2 * 9/2009 Hayami et al. ................. 326/30
7,834,654 B2 * 11/2010 Millar ................. H04L 25/0278 326/30
2006/0071683 A1 * 4/2006 Best et al. ...................... 326/30
2007/0100596 A1 5/2007 Hollis
2007/0103189 A1 * 5/2007 Chang ................ G01R 31/3172 326/30
2008/0262818 A1 10/2008 Hollis (Continued)

*Primary Examiner* — Alexander H Taningco
*Assistant Examiner* — Nelson Correa
(74) *Attorney, Agent, or Firm* — Fletcher Yoder, P.C.

(57) ABSTRACT

Devices and methods for operating devices are provided, such as those that include a memory device having a reference voltage (Vref) circuit that has substantially similar paths and impedances as an on-die termination (ODT) circuit. One such Vref circuit tracks supply variations and temperature changes in a manner substantially similar to the ODT circuit. In some embodiments an update scheme is provide for the ODT circuit and the Vref circuit to enable simultaneous update of each circuit through the same digital codes.

24 Claims, 4 Drawing Sheets

(56) References Cited

U.S. PATENT DOCUMENTS

| | | | | |
|---|---|---|---|---|
| 2008/0291063 | A1 | 11/2008 | Hollis | |
| 2008/0304557 | A1 | 12/2008 | Hollis | |
| 2009/0010320 | A1 | 1/2009 | Hollis | |
| 2009/0063111 | A1 | 3/2009 | Hollis | |
| 2009/0092180 | A1 | 4/2009 | Hollis | |
| 2009/0094302 | A1 | 4/2009 | Hollis | |
| 2009/0102511 | A1 * | 4/2009 | Hirose | H03K 19/00384 326/30 |
| 2009/0110116 | A1 | 4/2009 | Hollis | |
| 2009/0112549 | A1 | 4/2009 | Hollis | |
| 2009/0112551 | A1 | 4/2009 | Hollis | |

* cited by examiner

FIG. 5
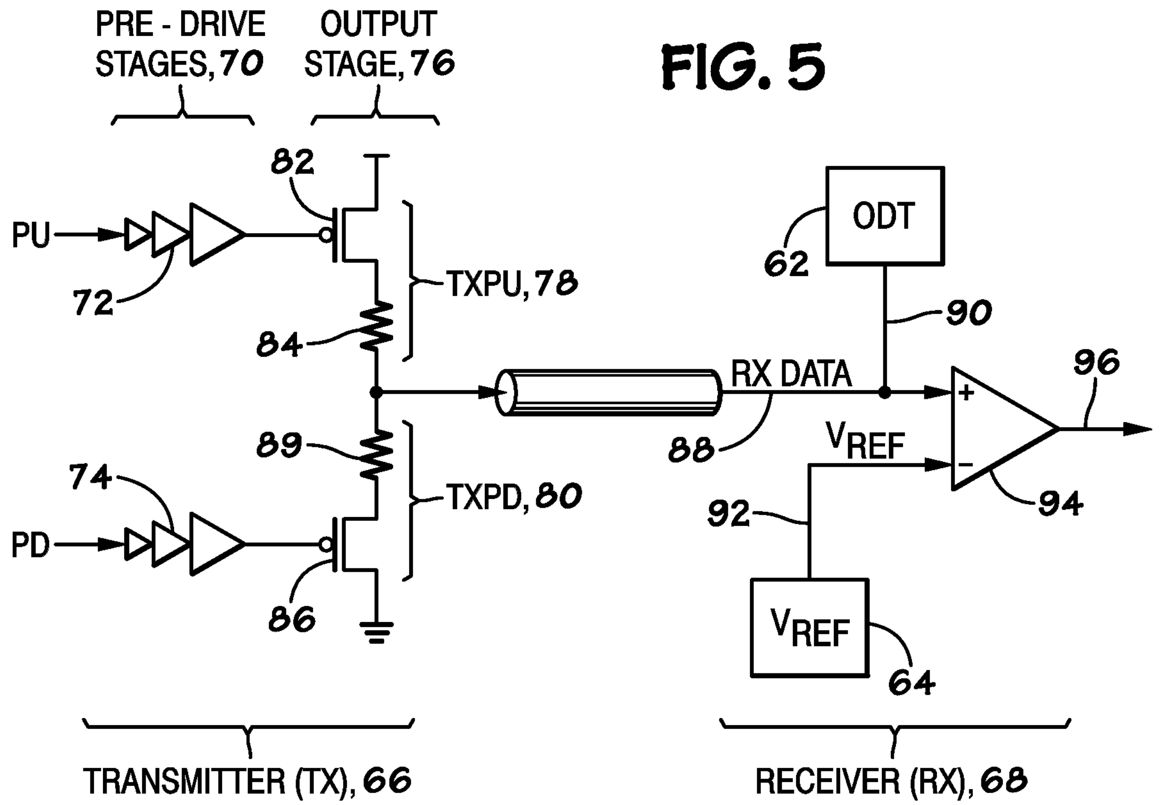
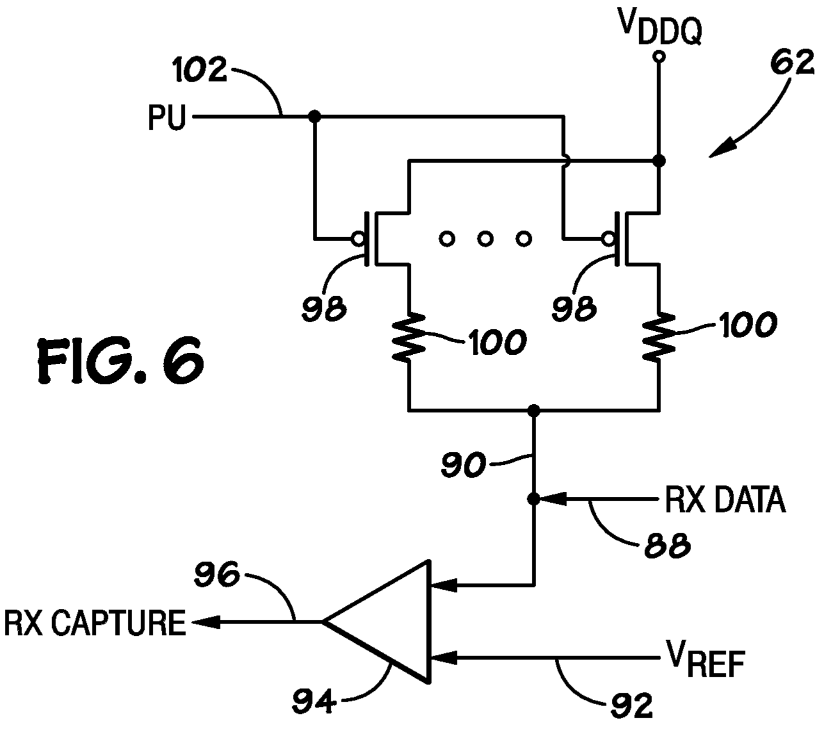
FIG. 6

REFERENCE VOLTAGE CIRCUITS AND ON-DIE TERMINATION CIRCUITS, METHODS FOR UPDATING THE SAME, AND METHODS FOR TRACKING SUPPLY, TEMPERATURE, AND/OR PROCESS VARIATION

BACKGROUND

Field of Invention

One or more embodiments of the invention relate generally to the field of digital communications and more particularly, to techniques for generating and adjusting reference voltages and impedances.

Description of Related Art

Processing speeds, system flexibility, and size constraints are typically considered by design engineers tasked with developing computer systems and system components. Computer systems generally include a plurality of memory devices which may be used to store programs and data and which may be accessible to other system components such as processors or peripheral devices. The memory devices, typically, are grouped together to form memory modules such as dual-inline memory modules (DIMMs). Further, computer systems may incorporate numerous memory modules to increase the storage capacity of the system.

Generally, each memory device of a memory module includes one or more off-chip drivers (OCDs) for driving signals off-chip during data transmission and one or more on-die termination (ODT) circuits for terminating the off-chip transmission-line during data reception. Both the output impedance of the OCD and the termination impedance of the ODT are critical to maintaining suitable signal integrity during chip-to-chip communication, as the relationship between these values (OCD impedance and ODT impedance) and the characteristic impedance of the chip-to-chip transmission line will determine both the nominal signal swing and the level of signal-degrading reflections on the line. Because the OCD impedance and ODT impedance are critical, both values are typically made adjustable, which adjustments often take place during a link initialization stage at system power-up.

In pseudo-differential links, such as those adopted by many memory interface standards, a reference voltage (Vref) may also be generated by a reference voltage circuit and provided to the data capture circuitry during data reception. However, variations in supply level and temperature will cause all of these parameters, OCD impedance, ODT impedance, and Vref level to fluctuate or drift with distinct behaviors.

BRIEF DESCRIPTION OF DRAWINGS

FIG. 5 is a schematic diagram of a transmitter and receiver in accordance with an embodiment of the present invention;

FIG. 6 is a schematic diagram of an on-die termination circuit in accordance with an embodiment of the present invention;

DETAILED DESCRIPTION

As discussed in further detail below, embodiments of the present invention include a reference voltage (Vref) circuit that has substantially similar paths and impedances as an on-die termination (ODT) circuit. More specifically, the similarity enables the Vref circuit impedances to track supply variations and temperature changes in a similar manner as the ODT circuit impedances. Further, in some embodiments an update scheme is provided for the ODT circuit and the Vref circuit to enable the simultaneous update of both circuits, thus minimizing discontinuities that would otherwise negatively impact data transmission and data capture.

Figure 1:
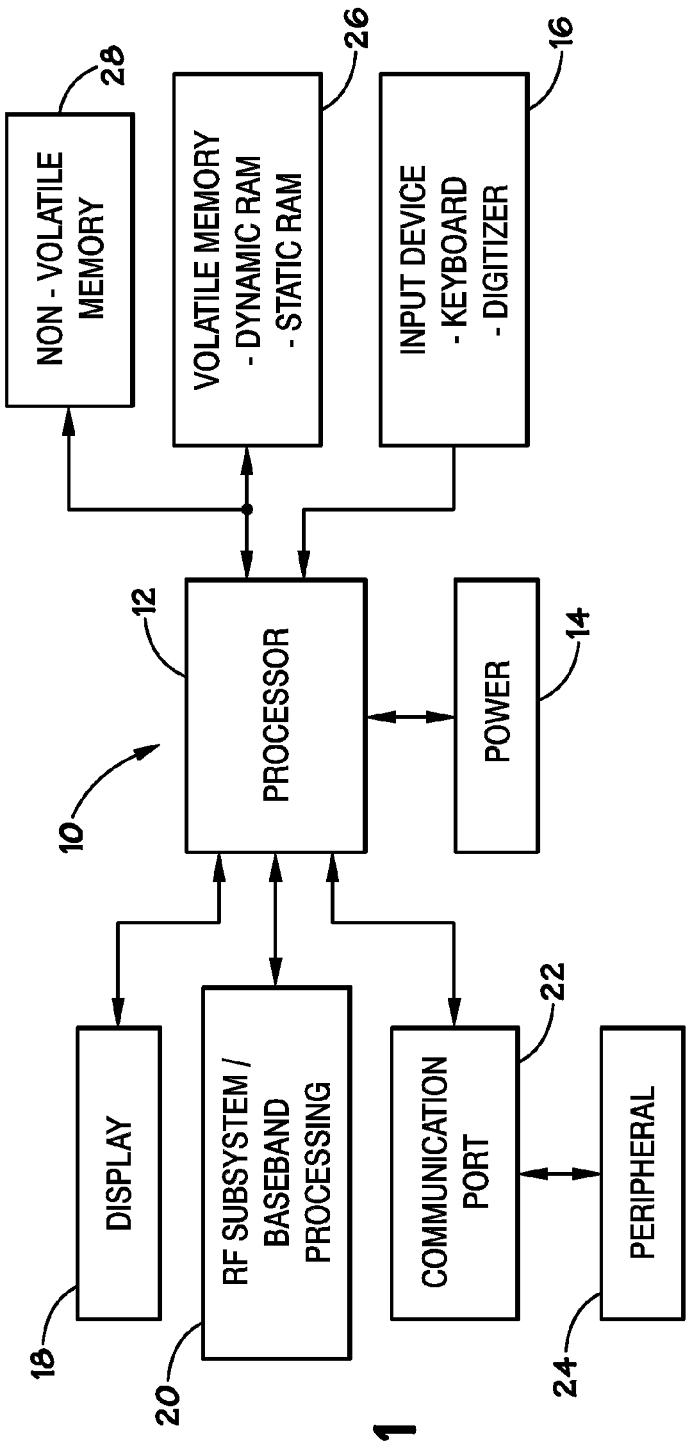
FIG. 1 is a block diagram that illustrates a processor based system in accordance with one or more embodiments of the present invention.

Turning now to the figures, FIG. 1 is a block diagram that depicts a processor-based system, generally designated by reference numeral 10. The system 10 may be any of a variety of types such as a computer, pager, cellular phone, personal organizer, control circuit, etc. In a typical processor-based system, one or more processors 12, such as a microprocessor, control the processing of system functions and requests in the system 10.

The system 10 typically includes a number of components. For example, the system 10 includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
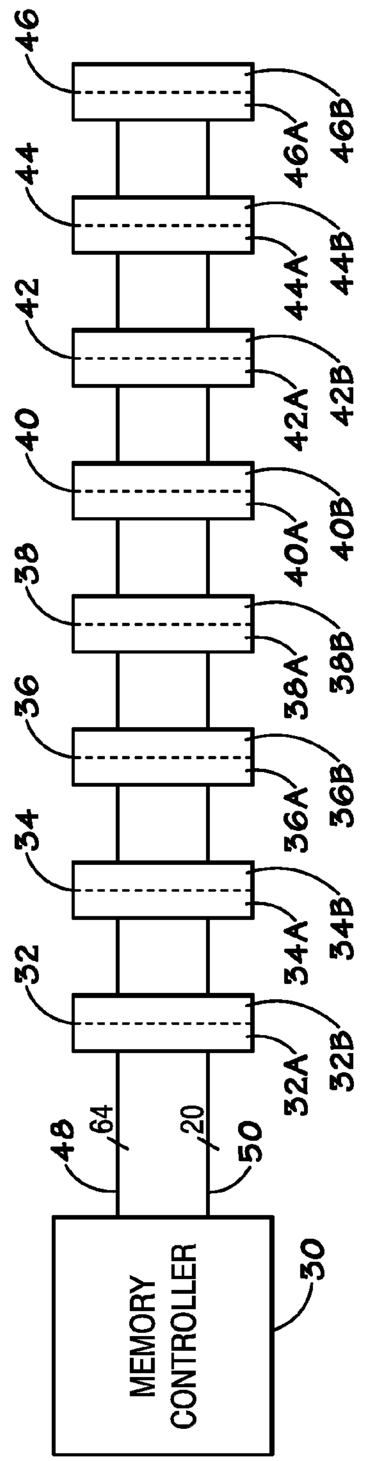
FIG. 2 is a block diagram that illustrates a memory sub-system in accordance with one or more embodiments of the present invention.

FIG. 2 generally illustrates a block diagram of a portion of a memory sub-system, such as the volatile memory 26. A memory controller 30 is generally provided to facilitate access to storage devices in the volatile memory. The memory controller 30 may receive requests to access the storage devices via one or more processors, such as the processor 12, via peripheral devices, such as the peripheral device 24, and/or via other systems. The memory controller 30 is generally tasked with facilitating the execution of the requests to the storage devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data, as described further below with reference to FIG. 3. Each DIMM has a number of memory devices on each side of the module. Each side of the module may be referred to as a "rank." Accordingly, each slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present embodiment, each of the eight memory slots 32-46 is capable of supporting a module comprising eight individual memory devices on each rank 32A/B-46 A/B, as best illustrated with respect to FIG. 3, described further below.

Referring again to FIG. 2, the memory buses may include a memory data bus 48 to facilitate the exchange of data between each memory device on the DIMM and the memory controller 30. The memory data bus 48 comprises a plurality of single bit data buses (e.g., line DQ illustrated in FIG. 4), each coupled from the memory controller 30 to a memory device, each single bit data bus comprising at least one off-chip driver (OCD) for data transmission across the bus and one data receiver for capturing and interpreting data received from the bus. In terminated systems, the receiver circuitry may comprise, in addition to the capture mechanism (latch, etc.), an ODT for terminating the signal and absorbing the signal energy received from the bus. In one embodiment of the volatile memory 26, the memory data bus 48 may include 64 or more individual data buses. Further, the memory data bus 48 may include one or more individual buses to each memory rank 32A/B-48A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described, with reference to the memory data bus 48, a variety of embodiments may be implemented for the command bus 50 depending on the system configuration.

Figure 3:
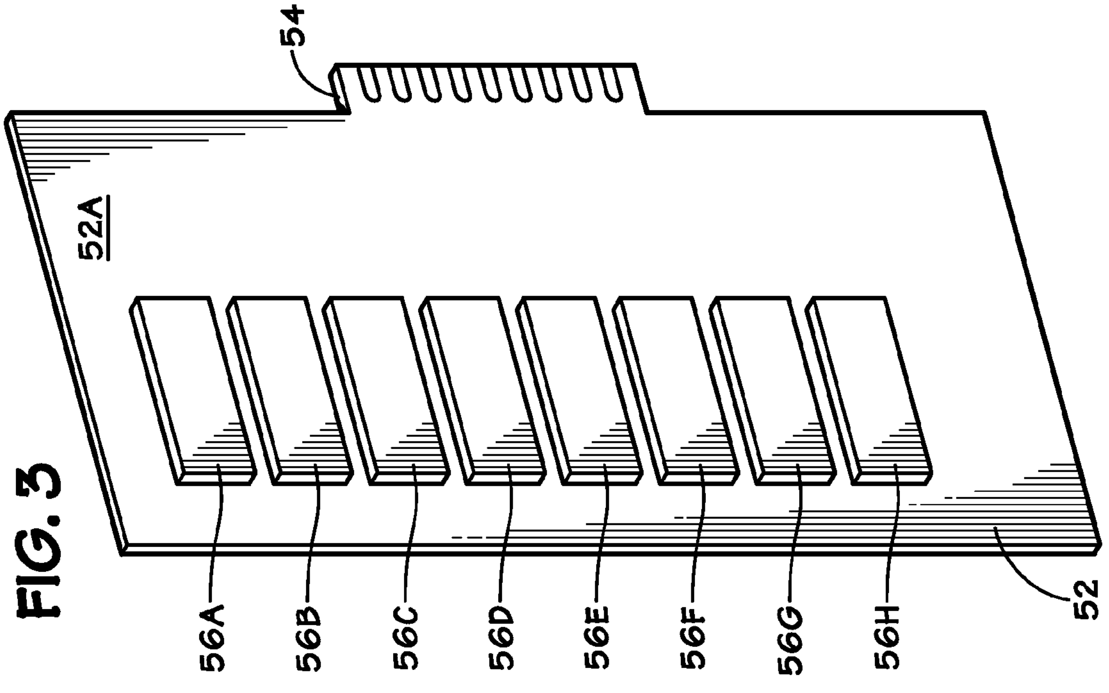
FIG. 3 is a block diagram that illustrates a memory module in accordance with one or more embodiments of the present invention.

FIG. 3 illustrates a memory module 52, such as a DIMM, that may be inserted into one of the memory slots 32-46 (FIG. 2). In the present view, one side of the memory module 52 is illustrated, and generally designated as the rank 52A. As previously discussed, the memory module 52 may include two ranks 52A and 52B. The rank 52A includes a plurality of memory devices 56A-56H, such as synchronized dynamic random access (SDRAMs), which may be used for storing information. As will be appreciated, the second opposing side of the memory module 52 (52B, not shown) also includes a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second rank) on the memory module 52.

Figure 4:
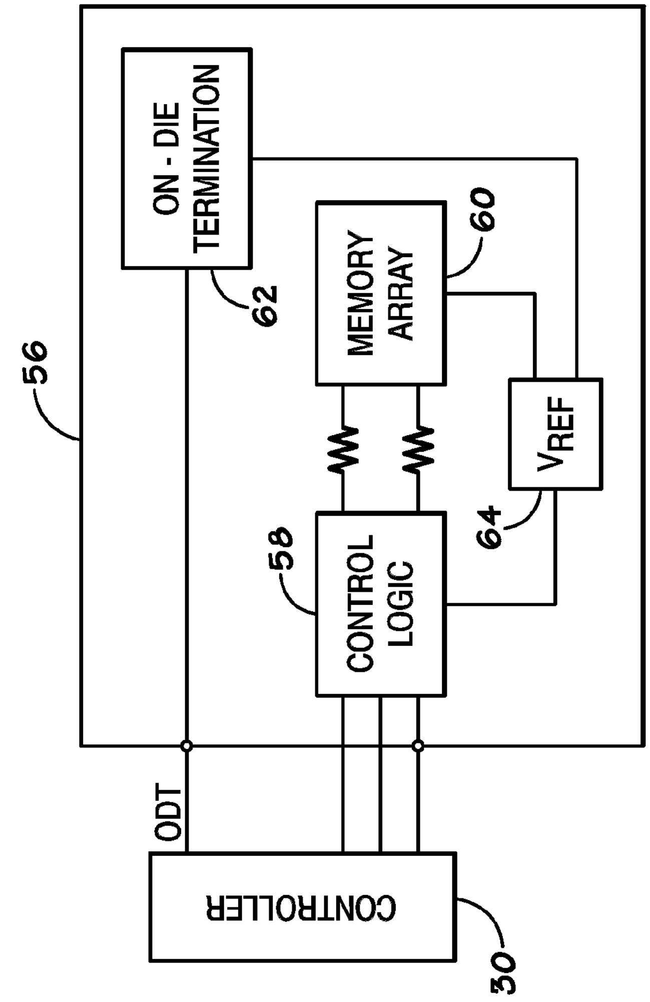
FIG. 4 is a simplified block diagram of a memory device in accordance with an embodiment of the present invention.

FIG. 4 is a block diagram of a memory device 56 (e.g., in the volatile memory 26) illustrating certain components in accordance with an embodiment of the present invention. As mentioned above, the memory device 56 may be coupled to a controller 30 that provides various signals for operation of the memory device 56. In some embodiments, that memory controller 30 may comprise a stand-alone integrated circuit (IC), while in other embodiments, the memory controller functionality may be integrated into a central processing unit (CPU). The memory device 56 may include control logic 58 to receive and process signals received from the controller 30. The memory device 56 may include a memory array 60 that comprises any suitable memory structure, e.g., memory cells, wordlines, bitlines, etc. It should be appreciated that in a typical embodiment various other components, such as buffers, decoders, multiplexers, etc., may be included in the memory device 56 to facilitate internal processing of signals and enable operation of the memory device 56.

The memory device 56 may include one or more ODT circuits 62 for impedance matching and termination of signals received by the memory device 56. In some embodiments, the impedance of the ODT circuit 62 may be programmed using transistors (and combinations of resistors) to achieve a desired impedance.

The memory device 56 may also include a Vref circuit 64 for generating a Vref from a received voltage. For example, power supply voltages received by the memory device 56 (such as from the power supply 14) may be processed and conditioned to provided a suitably stable Vref for use by various components of the memory device 56, such as by the receiving circuitry, memory array 60, etc. The output of the Vref circuit 64 may also serve as an analog bias level for analog circuits on the memory device.

FIG. 5 is a schematic diagram of the transmitter (TX) 66 of an OCD and the corresponding receiver (RX) 68 on the memory device 56. The transmitter (TX) 66 may include pre-drive stage 70 having both pull-up (PU) predrivers 72 and pull-down (PU) pre-drivers 74. The transmitter (TX) 66 may also include an output stage 76 that includes a pullup leg (TXPU) 78 coupled to the pullup predrivers 72 and a pulldown leg (TXPD) 80 coupled to the pulldown predrivers 74. For example, the pullup leg (TXPU) 78 may include various components, such as a transistor 82 and resistor 84. Similarly, the pulldown leg (TXPD) of the transmitter (TX) 66 may include components such as a transistor 86 and resistor 89. The output from the signal driver (referred to as RX data signal 88 when received at and by the receiver 68) and the reference voltage signal 92 of the Vref circuit 64 are latched by data capture latch 94, as described further below. As seen in FIG. 5, any differences in the output signals (and/or characteristics) of the transmitter (TX) 66 of the OCD, the ODT circuit 62, and the Vref circuit 64 may affect the RX capture signal 96 output from the data capture latch 94.

FIG. 6 is a schematic diagram of the ODT circuit 62 using VDDQ (supply voltage)-referenced termination in accordance with an embodiment of the present invention. The ODT circuit 62 may include a plurality of transistors 98 (e.g., PMOS devices as shown in FIG. 5 or NMOS devices in other embodiments) and resistors 100 to improve linearity of the ODT output. In an alternative embodiment, the ODT may comprise transistors exclusively. In the VDDQ-referenced example, the ODT circuit 62 is connected between VDDQ and the incoming signal trace (RX). In other embodiments, the ODT circuit 62 may connect the incoming signal trace (RX signal 88) to VSSQ through NMOS devices (i.e., VSSQ-referenced termination). The ODT circuit 62 may also connect to both VDDQ and VSSQ to provide the "center-tapped" termination, such as for the double-data-rate two (DDR2) and double-data-rate three (DDR3) memory interface standards. The ODT circuit 62 may receive digital codes (i.e., tuning codes) applied over pullup legs 102 to tune the termination impedance while also receiving incoming signal trace 88 (RX data). The node connecting the ODT circuit 62 with the incoming signal trace 88 also couples to the input of the data capture latch 94. In high-speed system embodiments, data capture latch 94 may comprise a sense-amplifier style comparison circuit, which performs a comparison of the incoming data signal terminated by the ODT circuit 62 and the Vref signal 92 provided by the Vref circuit 64. The data capture latch 94 outputs an RX capture signal 96 based on the relative signal levels of the ODT output 90 (wherein the ODT output results from RX signal 88 terminating across the ODT circuit 62) and the Vref signal 92.

The digital codes received over pullup leg 102 may be determined through ZQ calibration to update the impedance of the ODT circuit 62. Variations in process, supply voltage, and temperature may result in the drifting of the impedance of the ODT circuit 62. Further, such changes may affect other relevant signals (e.g., Vref signal 92) differently. Uncorrelated variations in the characteristics of the ODT circuit 62 and the Vref signal 92 may result in degraded margins at the point of data capture (e.g., relative signal levels may not drift together, which may be interpreted as noise by the comparison circuit). As described further below, the Vref signal 92 may be provided from a Vref circuit constructed in accordance with an embodiment of the present invention that eliminates or reduces such uncorrelated variations.

Figure 7:
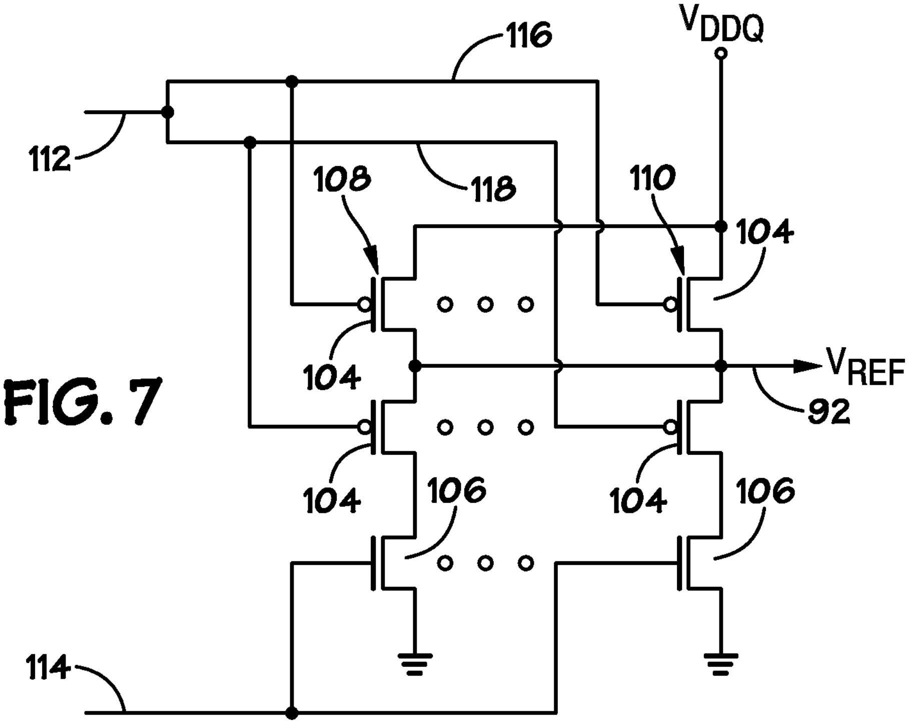
FIG. 7 is a schematic diagram of a reference voltage circuit compatible with the on-die termination circuit of FIG. 6 in accordance with an embodiment of the present invention.

FIG. 7 is a schematic diagram of Vref circuit 64 capable of tracking process, supply voltage, and temperature changes in parallel with the ODT circuit 62 in accordance with an embodiment of the present invention. The Vref circuit 64 of FIG. 7 uses a VDDQ-reference and includes a plurality of pullup transistors 104 (e.g., PMOS devices as shown in FIG. 7 or NMOS devices in other embodiments) arranged in series. The Vref circuit 64 also includes pulldown transistors 106 (e.g., NMOS devices as shown in FIG. 7 or PMOS devices in other embodiments). As shown in FIG. 7, the Vref circuit 64 includes a similar structure to the on-die termination circuit 62, by including a first series 108 of transistors 104 and a second series 110 of transistors 104.

Each series of transistors includes a pullup leg 112, comprising pullup transistors 104, and a pulldown leg 114, comprising the pulldown transistors 106. Each pullup leg 112 includes the first and second transistors 104. For example, as shown in FIG. 7, a pullup leg 112 includes a first control input 116 provided to a first transistor 104 and a second control input 118 provided to a second transistor. The pulldown legs 114 are designed to approximate the nominal pulldown characteristics of the OCD on the transmitter (TXPD 80). Both the pullup leg 112 and pulldown leg 114 are replicated and digital codes may be determined (e.g., through ZQ calibration) to tune the impedance of the Vref circuit 64. In one embodiment, pullup leg 112 and its replicas may be binary weighted, such that the impedance provided with each additional leg grows by a power of two.

The Vref signal 92 may be generated from between the two transistors 104 of each pullup leg 112, enabling the Vref signal 92 level to fall midway between the nominal high and low values. Thus, the Vref circuit 64 may also be described as a voltage divider with respect to the supply voltage (e.g., VDDQ or VSSQ), such that the Vref signal 92 shifts up or down with variations in the supply voltage.

The pullup leg 112 and pulldown leg 114 may be designed to match the relative (p/n) impedances of the ODT circuit 62 and transmitter's OCD (TXPD 80) legs over the same digital codes. The transistors 104 may be sized to provide an equal channel resistance (RON) for the same set of digital codes applied to the ODT circuit 62. For example, if the transistors have equal RON and the p/n ratio of the transistors equals the ratio of ODT to TXPD, then the Vref signal 92 output by the Vref circuit 64 will be centered, with respect to the incoming signal's high and low levels. In some embodiments, the transistors 104 may be reduced in size to reduce static current drawn while generating the Vref signal 92, if the p/n ratio is maintained with the same digital codes. Other embodiments may include additional topologies. For example, Vref may be generated by replacing the bottom transistor 104 with a resistor, in an effort to better match the ODT circuit 62 in FIG. 6. Similarly, the ODT can be generated with a circuit substantially similar to ODT circuit 62, but with all resistors replaced by transistors, to better match the Vref circuit 64 of FIG. 7.

As mentioned above, the Vref signal 92 is generated between the transistors 104 of pullup legs 112 and may be centered between the signal swing levels during an initialization process using the same digital codes determined through ZQ calibration to achieve a desired impedance with the ODT circuit 62. In some embodiments, the digital codes applied to the ODT circuit 62 may be applied directly to the controls of the Vref circuit 64. In other embodiments, a different set of control signals may be used, but these values may also be determined through the ZQ calibration process to maintain similar characteristics between the ODT circuit 62 and the Vref circuit 64. These steps allow the Vref signal 92 to track variations in supply level (e.g., voltage drift) and remain centered (or maintain relative location) between the high and low levels of the incoming signal. Further, impedance matching the Vref circuit 62 and the ODT circuit 64 using similar, if not identical, topologies as described above enables the Vref circuit 64 to track variations in the ODT impedance resulting from temperature drift. As also mentioned above, it should be appreciated that the reference voltage circuit 64 may also be implemented for other supply voltage references (e.g., VSSQ).

Figure 8:
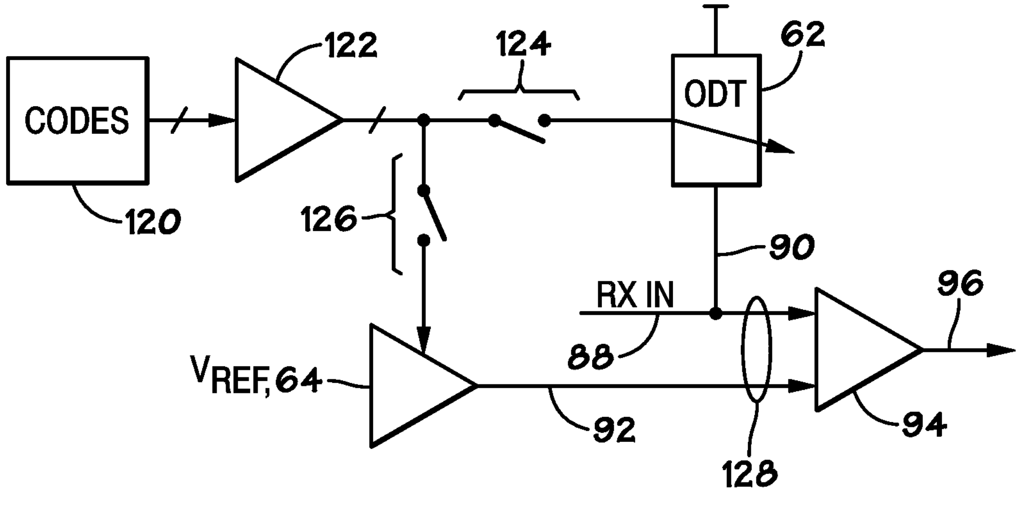
FIG. 8 is a schematic diagram of an update scheme for a reference voltage circuit and on-die termination circuit in accordance with an embodiment of the present invention.

In some embodiments, an "update glitch" may be induced on the RX signal trace 88. For example, the discontinuous nature of digital ODT updates may introduce glitches or temporary noise (e.g., a DC shift or AC shift) onto the incoming signal trace 88. When no corresponding glitch occurs simultaneously on the Vref signal 92, the uncorrelated noise will degrade the timing and/or voltage margins associated with the data capture operation. FIG. 8 is a schematic for updating the ODT circuit 62 and Vref circuit 64 to eliminate or reduce glitches in accordance with an embodiment of the present invention. The update scheme may maintain the relationship between the pullup legs 112 of the Vref circuit 64 and the pullup legs 102 of the ODT circuit 62 by enabling the Vref circuit 64 and ODT circuit 62 to operate off of the same digital codes (i.e., tuning codes). As described below, any updates to the ODT circuit 62 are simultaneously provided to the Vref circuit 64 and, as a result, equivalent noise events or glitches occur on both outputs, reaching a comparison circuit (e.g., data latch 94) simultaneously. Because the comparison circuit is differential by nature (e.g., amplifying the difference between the signals received as inputs), the equivalent noise events on the incoming signal 88 and the Vref signal 92 cancel out, thus maintaining sufficient timing and/or voltage margins during the data capture operation, even in the event of an impedance update.

As shown in FIG. 8, calculated codes 120 representing the updates to the ODT circuit 62 may be latched (via code latch 122) and distributed to the ODT circuit 62 (via path 124). The update codes 120 are also distributed to the Vref circuit 64 via path 126. As explained above, the updated codes 120 may introduce a glitch on the RX signal 88 when the ODT circuit 62 is updated. If so, a similar glitch will also be introduced onto the Vref signal 92 when the updated codes 120 are distributed to the Vref circuit 64. As described above in FIGS. 5-6, the RX signal 88 and Vref signal 92 are provided to a data capture latch 94. As shown in region 128, the glitches of the Vref signal 92 and RX signal 88 cancel each other out at the input of the data capture latch 94. Thus the data capture process is not hindered by glitches and the RX capture signal 96 will be free of any glitches potentially introduced by the update codes. By matching the Vref impedance and distribution path with the ODT impedance and distribution path, as shown in FIGS. 6 and 7, and trigging simultaneous updates, as shown in FIG. 8, the Vref signal 92 may track any supply level and/or temperature changes, and any glitches resulting from the updated digital codes applied to the ODT circuit 62 may be canceled out. Further, as the updates are provided to the Vref circuit 64 and ODT circuit 62 simultaneously, the bus is not interrupted (stopped or started) to apply the updated codes to either circuit.

In other embodiments, the Vref signal 92 tracking and glitch canceling may be enabled by providing independent codes for the Vref circuit 64 and the ODT circuit 62, e.g., non-simultaneous update codes applied to the Vref circuit 64 and ODT circuit 62. However, such an embodiment may not produce optimal canceling of glitches as the embodiment depicted in FIG. 8. In yet other embodiments, distinct codes may be sent to each circuit, suitable for producing the desired impedances, but sent simultaneously to reduce or eliminate glitching.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims. For example, while described as implemented in a memory system, the Vref generation and update scheme proposed would be compatible and add benefit to any single-ended interface using pseudo-differential data capture (e.g., the comparison-based receiver). The invention has also been described as it would be implemented in a uni-directional interface, but the invention may be appropriately applied in bi-directional interfaces as well.

What is claimed is:

1. A memory device, comprising:

an on-die termination circuit (ODT); and a reference voltage circuit, wherein the reference voltage circuit tracks changes in supply voltage and temperature substantially the same as the on-die termination circuit to produce a variable reference voltage.

2. The device of claim 1, wherein the reference voltage circuit comprises a first series of transistors and a second series of transistors.

3. The device of claim 2, wherein each of the series of transistors comprises a pullup leg and a pulldown leg.

4. The device of claim 3, wherein the pullup leg comprises two transistors.

5. The device of claim 4, wherein a reference voltage is generated from between the two transistors of the pullup leg.

6. The device of claim 4, wherein the transistors of the pullup leg comprise PMOS devices, wherein each of the PMOS devices has substantially the same channel resistance.

7. The device of claim 3, wherein the pulldown leg comprises a transistor.

8. The device of claim 7, wherein an impedance of the pulldown leg approximates a nominal pulldown characteristic of an off-chip driver (OCD) of a transmitter that is communicatively coupled to the device.

9. The device of claim 8, wherein the pullup leg and the pulldown leg are configured to match a relative impedance of the ODT circuit and the OCD of the transmitter over digital codes used to achieve a desired impedance of the ODT circuit.

10. A memory device, comprising:

an on-die termination circuit (ODT) comprising a first path having one or more transistors; and a reference voltage (Vref) circuit comprising a second path having a plurality of transistors, wherein the path of the ODT circuit and the path of the Vref circuit have substantially the same impedance;

wherein the reference voltage circuit produces a variable reference voltage.

11. A device, comprising:

a reference voltage circuit compatible with on-die termination (ODT), comprising a pullup leg, the pullup leg comprising a first transistor and a second transistor, wherein a variable reference voltage is generated from between each of the transistors.

12. The memory device of claim 11, wherein the first and second transistors comprise a first PMOS device and a second PMOS device, respectively, wherein the reference voltage signal is generated from a voltage divided between the first PMOS device and the second PMOS device.

13. The device of claim 12, comprising an other pullup leg, wherein the other pullup leg comprises a third PMOS device and a fourth PMOS device, wherein the reference voltage signal is also generated from the voltage divided between the third PMOS device and the fourth PMOS device.

14. The device of claim 11, comprising a receiver circuit.

15. The device of claim 14, wherein the receiver circuit comprises a latch configured to latch the reference voltage signal and an incoming signal formed across the receiver circuit.

16. The device of claim 11, wherein the device is a memory device.

17. A device, comprising:

a first distribution path coupled to an on-die termination (ODT) circuit; and a second distribution path coupled to a reference voltage circuit, wherein updates to the ODT circuit and the reference voltage circuit are substantially simultaneously provided to the ODT circuit and the reference voltage circuit, and wherein the reference voltage circuit produces a variable reference voltage.

18. The device of claim 17, wherein the updates comprise a set of codes for modifying the impedance of the ODT circuit.

19. The memory device of claim 17, further comprising a latch configured to latch an incoming signal formed across the ODT circuit and a reference voltage signal generated by the reference voltage circuit.

20. A method of operating a device, comprising:

providing a first update to an on-die termination (ODT) circuit on a first distribution path;

providing a second update to a reference voltage circuit, wherein the first update and second update are provided to the ODT circuit and the reference voltage circuit, substantially simultaneously, and wherein the reference voltage circuit produces a variable reference voltage.

21. The method of claim 20, wherein substantially simultaneously providing the first and second updates comprises substantially simultaneously providing the first updates to the ODT circuit and the second update to the reference voltage circuit such that an impedance of the reference voltage circuit and an impedance of the ODT circuit are substantially the same.

22. The method of claim 21, wherein the first update comprises a first set of digital codes and the second update comprises the first set of digital codes.

23. The method of claim 20, wherein the first update comprises a first set of digital codes and the second update comprises a second set of digital codes.

24. The method of claim 20, comprising maintaining the same approximate ratio between an impedance of the ODT circuit and an impedance of the reference voltage circuit via the first and second updates respectively.

* * * * *